(12) United States Patent
Soe

(10) Patent No.: US 8,680,899 B2
(45) Date of Patent: Mar. 25, 2014

(54) HIGH PERFORMANCE DIVIDER USING FEED FORWARD, CLOCK AMPLIFICATION AND SERIES PEAKING INDUCTORS

(75) Inventor: Zaw Soe, Encinitas, CA (US)

(73) Assignee: Tensorcom, Inc., Carlsbad, CA (US)

( * ) Notice: Subject to any disclaimer, the term of this patent is extended or adjusted under 35 U.S.C. 154(b) by 172 days.

(21) Appl. No.: 13/243,908

(22) Filed: Sep. 23, 2011

(65) Prior Publication Data

US 2013/0076408 A1 Mar. 28, 2013

(51) Int. Cl.
*H03B 19/00* (2006.01)

(52) U.S. Cl.
USPC .......................................... 327/117; 327/115

(58) Field of Classification Search
USPC ..................... 327/113–123; 326/80–83, 89
See application file for complete search history.

(56) References Cited

U.S. PATENT DOCUMENTS

| | | | |
|---|---|---|---|
| 4,442,410 A | 4/1984 | Daniel | |
| 4,843,341 A | 6/1989 | Hosticka et al. | |
| 5,264,736 A | 11/1993 | Jacobson | |
| 5,361,041 A | 11/1994 | Lish | |
| 5,396,128 A | 3/1995 | Dunning | |
| 5,589,783 A | 12/1996 | McClure | |
| 5,959,504 A | 9/1999 | Wang | |
| 6,057,714 A | 5/2000 | Andrys et al. | |
| 6,340,899 B1 * | 1/2002 | Green | 326/83 |
| 6,590,430 B2 | 7/2003 | Sendelweck | |
| 6,646,508 B1 | 11/2003 | Barbetta | |
| 6,777,988 B2 * | 8/2004 | Tung et al. | 327/115 |
| 6,801,090 B1 | 10/2004 | Abernathy | |
| 6,937,071 B1 | 8/2005 | Moraveji | |
| 6,980,055 B2 | 12/2005 | Gharpurey | |
| 7,181,180 B1 | 2/2007 | Teo et al. | |
| 7,486,145 B2 | 2/2009 | Floyd et al. | |
| 7,528,656 B2 | 5/2009 | Lee et al. | |
| 7,897,484 B2 | 3/2011 | Kar-Roy et al. | |
| 8,004,361 B2 | 8/2011 | Lin | |
| 8,138,835 B2 | 3/2012 | Zeng et al. | |
| 2005/0206412 A1 | 9/2005 | Moraveji | |
| 2007/0090877 A1 | 4/2007 | Bagheri | |
| 2007/0115086 A1 | 5/2007 | Molins | |
| 2010/0013557 A1 | 1/2010 | Cao | |
| 2010/0039092 A1 | 2/2010 | Cordier et al. | |

FOREIGN PATENT DOCUMENTS

WO 2011/107159 9/2011

OTHER PUBLICATIONS

Chen, M; Wang, K H; Zhao, D; Dai, L; Soe, Z; Rogers, P. "A CMOS Bluetooth Radio Transceiver Using a Sliding-IF Architecture", IEEE 2003 Custom Integrated Circuits Conference.

(Continued)

*Primary Examiner* — Lincoln Donovan
*Assistant Examiner* — Diana J Cheng
(74) *Attorney, Agent, or Firm* — Thaddeus Gabara; Tyrean Patent Prosecution Law Firm

(57) ABSTRACT

A phase lock loop (PLL) is an important component in wireless systems. CMOS technology offers voltage controlled oscillator designs operating at 60 GHz. One of the difficulties is dividing the high frequency clock down to a manageable clock frequency using conventional CMOS. Although injection locked dividers can divide down this clock frequency, these dividers have limitations. A divide by 2 is presented that uses several techniques; feed forward, clock amplification and series peaked inductors to overcome these limitations.

16 Claims, 7 Drawing Sheets

(56) References Cited

OTHER PUBLICATIONS

University of Rochester, Laboratory for Advanced integrated Circuits and Systems, "Divide-by-Odd-Number-Injection-Locked Frequency Dividers", http://www.ece.rochester.edu/research.laics/ilfd.html Copied [Sep. 3, 2011 6:09:46 AM], pp. 1-7.

Ranganathan Desikachan, Master of Science Thesis, "High-Speed CMOS Dual-Modulus Prescalers for Frequency Synthesis", Oct. 1, 2003, Oregon State University.

47 CFR § 15.257 Operation within the band 57-64 GHz.

U.S. Appl. No. 13/163,562, KhongMeng Tham.

* cited by examiner

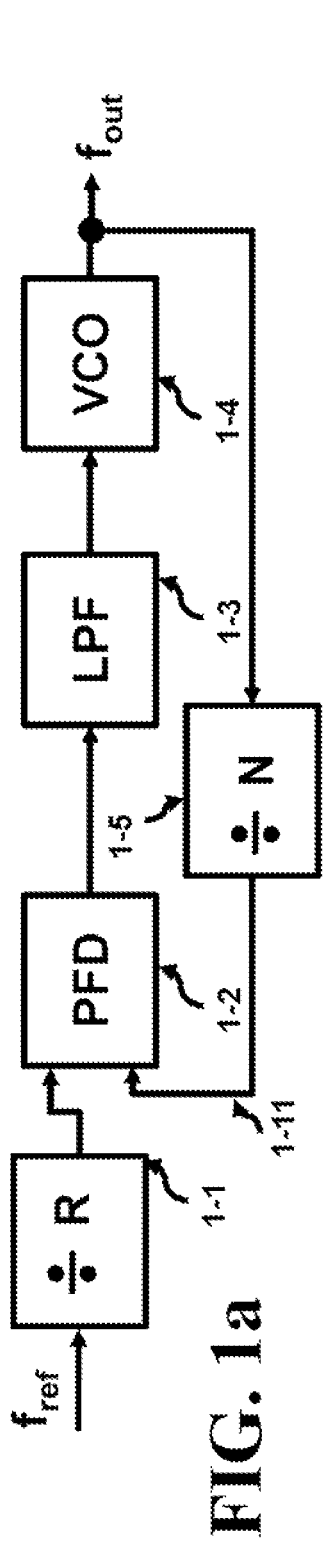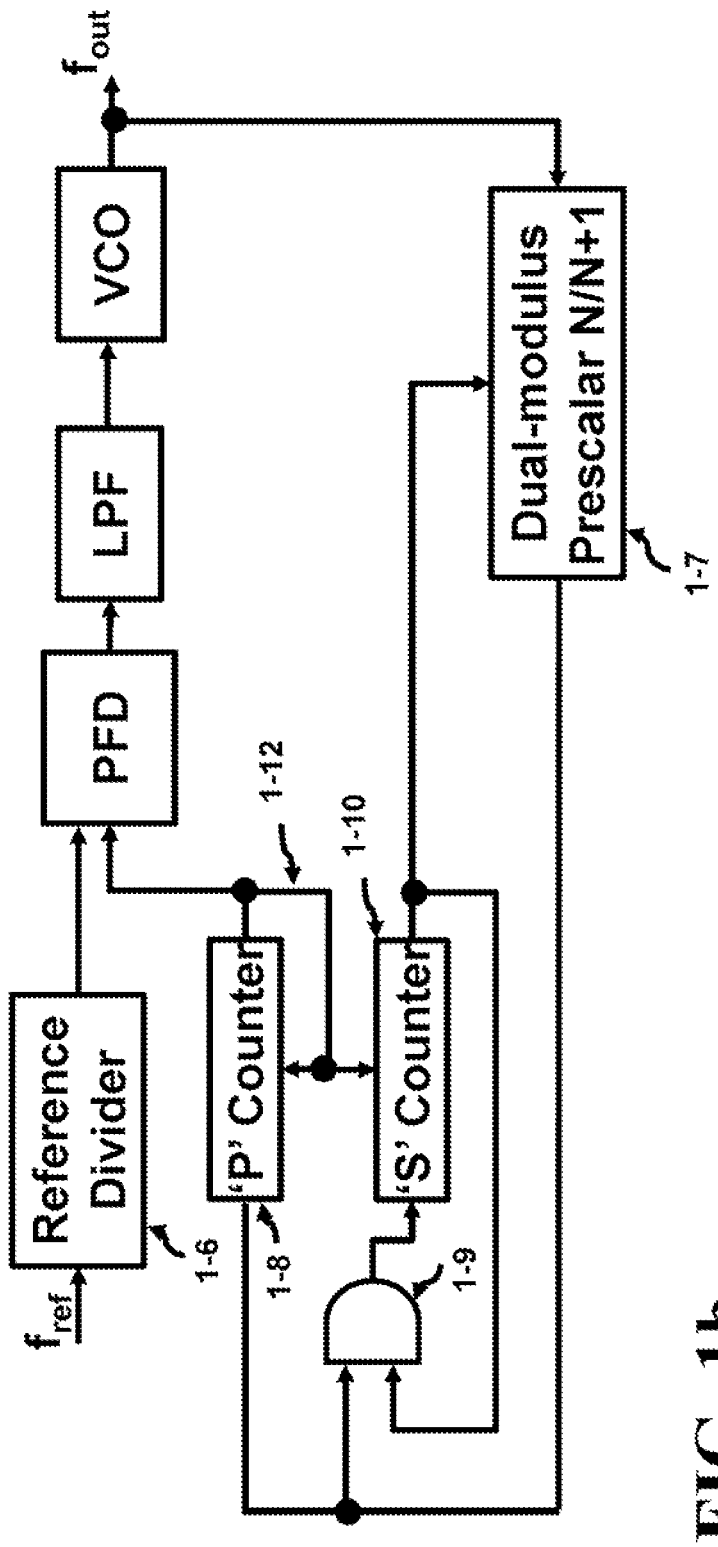
FIG. 1a
FIG. 1b

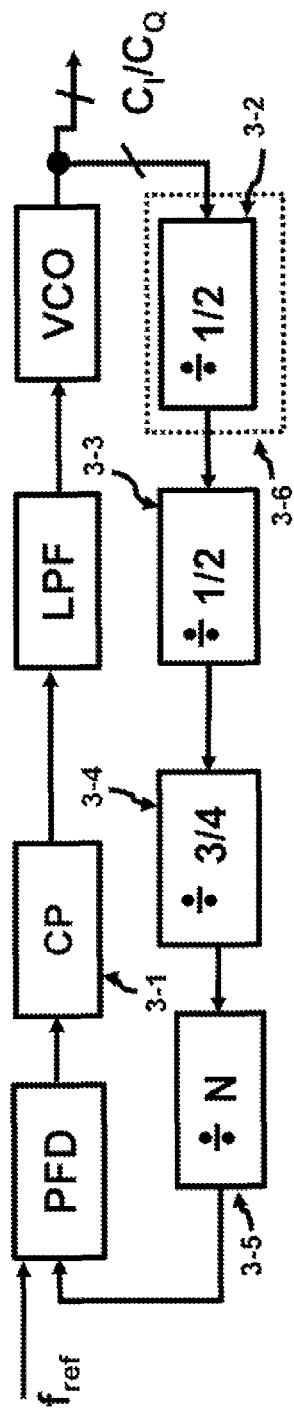
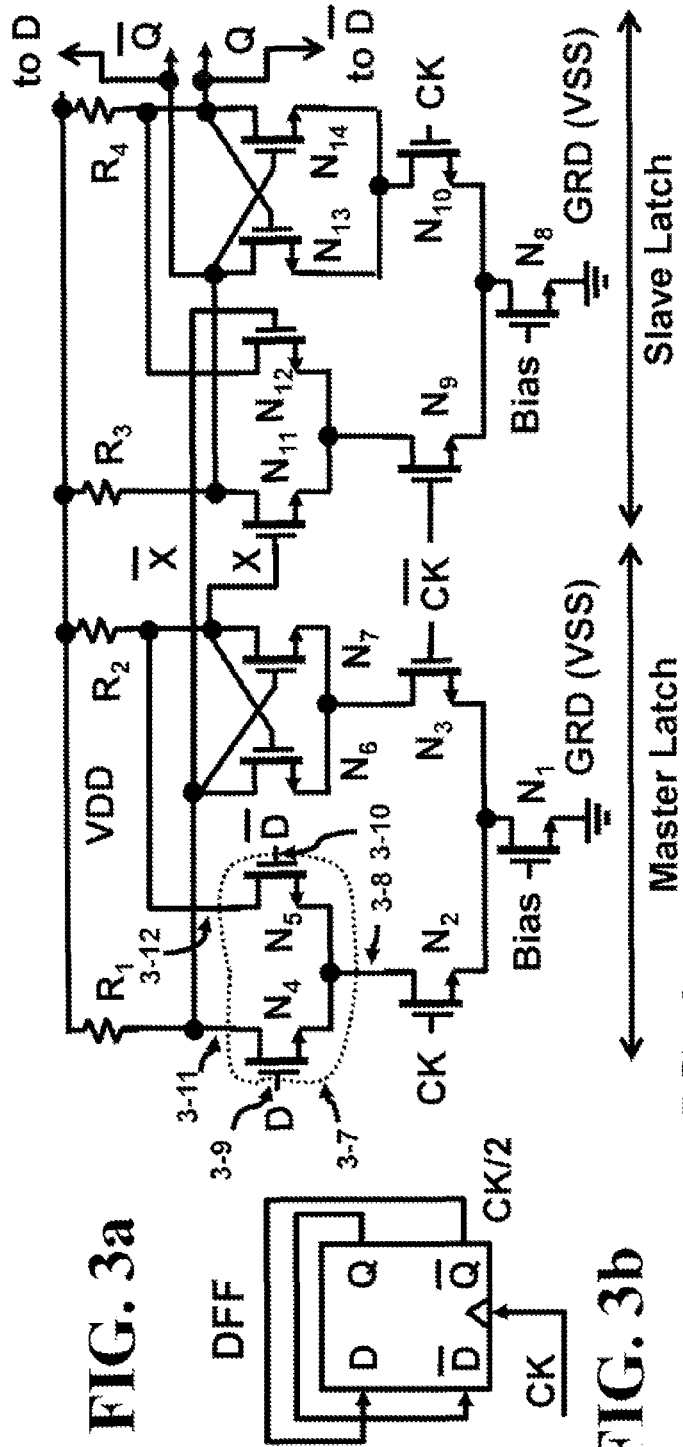
FIG. 3a
FIG. 3b
FIG. 3c

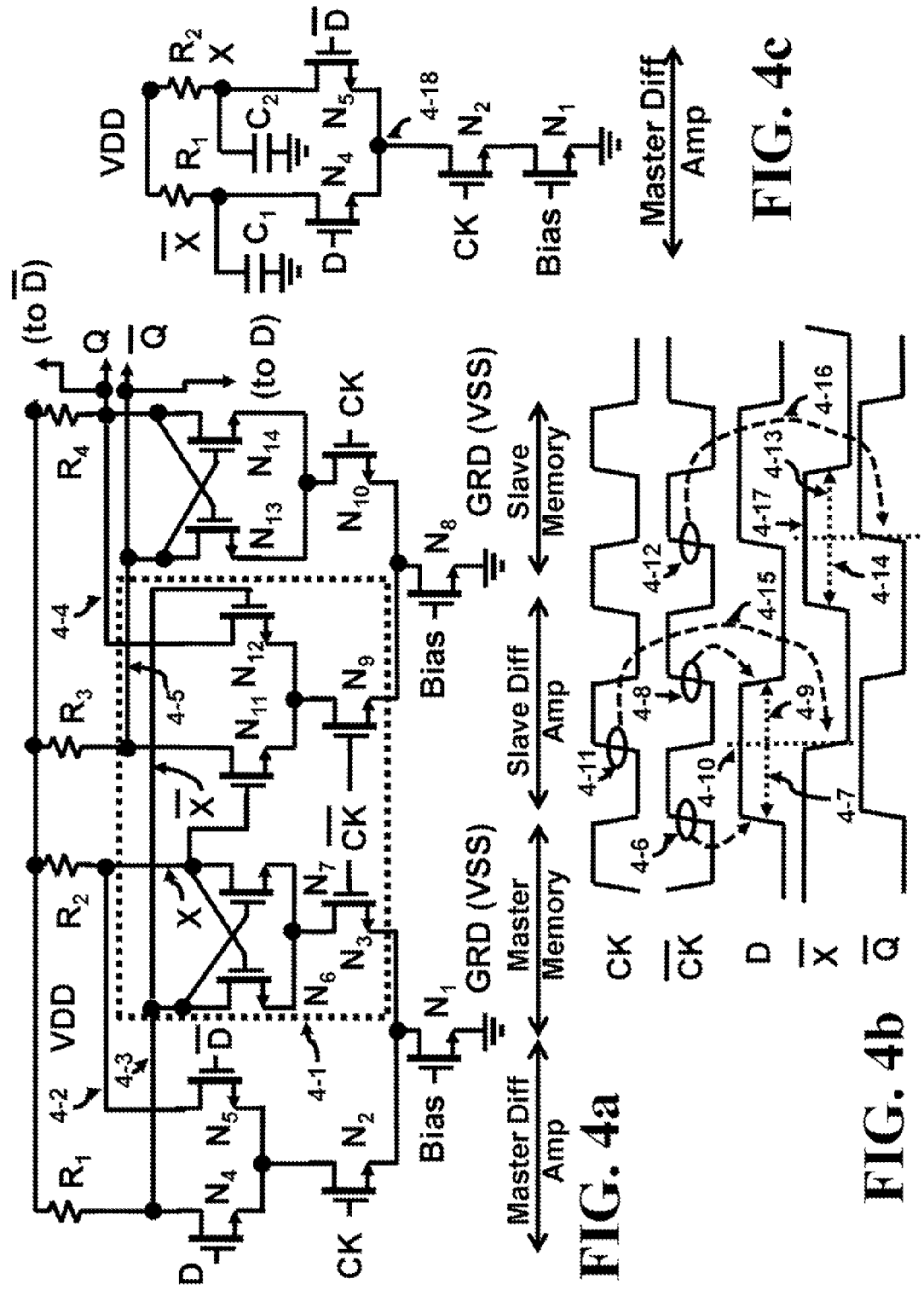

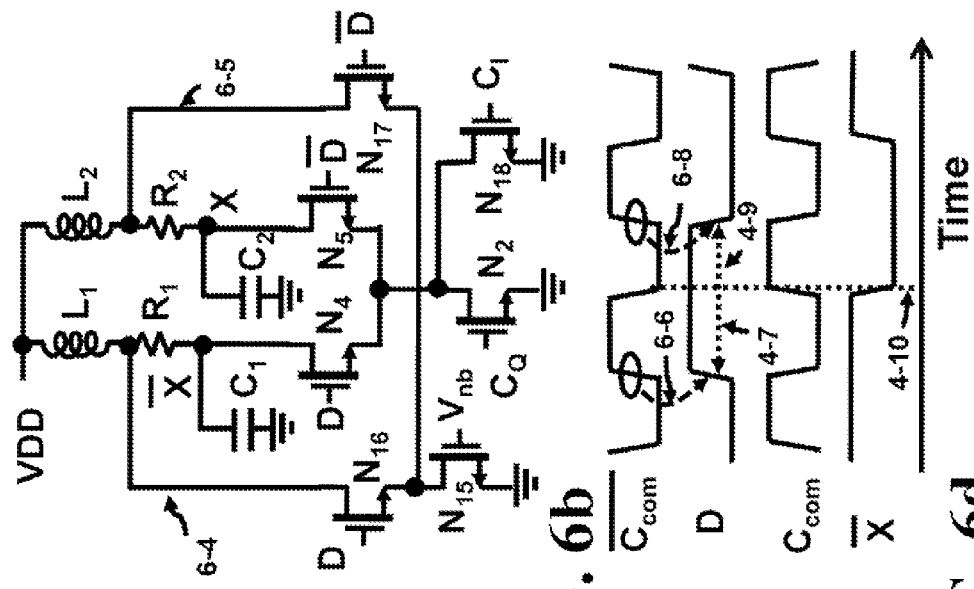
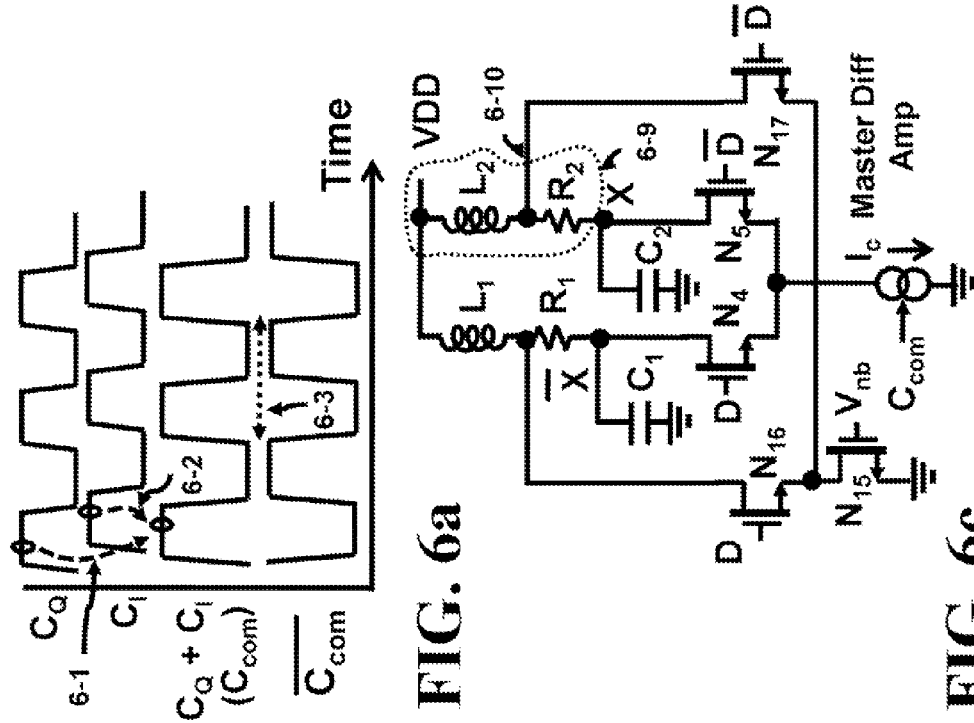
FIG. 6a
FIG. 6b
FIG. 6c
FIG. 6d

HIGH PERFORMANCE DIVIDER USING FEED FORWARD, CLOCK AMPLIFICATION AND SERIES PEAKING INDUCTORS

CROSS REFERENCE TO RELATED APPLICATIONS

The present application is related to the co-filed U.S. application Ser. No. 13/243,880 filed on the same day herewith entitled "A Differential Source Follower having 6 dB Gain with Applications to WiGig Baseband Filters", and the co-filed U.S. application Ser. No. 13/243,986 filed on the same day herewith entitled "Method and Apparatus of Minimizing Extrinsic Parasitic Resistance in 60 GHz Power Amplifier Circuit" both filed on Sep. 23, 2011, which are invented by the same inventor as the present application and incorporated herein by reference in their entireties.

BACKGROUND OF THE INVENTION

The Federal Communications Commission (FCC) has allotted a spectrum of bandwidth in the 60 GHz frequency range (57 to 64 GHz). The Wireless Gigabit Alliance (WiGig) is targeting the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS) while others can use either the Silicon-Germanium (SiGe) or Gallium Arsenide (GaAs) technology to form the dice in these designs. At 60 GHz, achieving the desired parameters of frequency synthesis using VCOs and high performance dividers present difficult challenges.

Oscillator and frequency synthesizers are elements in communication systems. The highest performance circuits in a given technology are usually measured in some form of an on-chip oscillator, such as a ring oscillator using transistors or a resonate oscillator that uses transistors and reactive components in a regenerative connection.

The frequency synthesizers are typically phase locked loops (PLL). A PLL generates a high frequency clock signal using a voltage controlled oscillator (VCO) and compares this signal against a reference frequency. A stable low frequency signal based, for example, on a crystal is used as one of the reference frequencies within the phase lock loop. The negative feedback within the phase lock loop suppresses any phase noise due to the oscillator that generates the high frequency clock signal and allows the generation of stable high frequency clock signals. A VCO is designed in a given technology to achieve the maximum possible performance and push against the edge of technology boundaries to generate a high frequency clock signal. This clock signal has such a short duration (16 ps) at 60 GHz that any conventional computational CMOS gate being clocked by this signal would fail since the duration is so short. A prescalar is a circuit that divides down the high frequency clock signal to provide more time to calculate a computation. The conundrum is that the prescalar is itself a computational unit.

The prescalar produces a lower frequency clock signal which provides more time to demanding circuits so that they can perform their required functions. However, a conventional CMOS divide-by-2 is not capable of operating at a clock rate of 60 GHz. An injection locked divider is typically used to create a high frequency divider. But the injection locked divider has limitations; 1) injection locked dividers have a very narrow locking range; and 2) commercial production of injection locked divider has not been well proven. Apparatus and methods are presented to overcome these limitations. A divide-by-2 is presented that incorporates these advances thereby eliminating the need for the injection locked divider.

BRIEF SUMMARY OF THE INVENTION

Various embodiments and aspects of the inventions will be described with reference to details discussed below and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

As the power supply voltage reduces in the scaling of integrated circuits, the voltage headroom for analog integrated circuits decreases correspondingly. This makes the design of high performance systems in a low power supply integrated circuit much more difficult and challenging. The CMOS VCO (Voltage Controlled Oscillator) in the PLL can generate a clock signal operating in the 60 GHz range of frequencies at reduced supply voltages. This clock signal needs to be divided down to a more manageable frequency before the remainder of the circuits on the chip can use this divided down clock signal. A divide by 2 is one of the first circuits to reduce the frequency of the clock signal to a more manageable frequency. The divide by 2 divides the high frequency clock signal (f) in half to generate a clock signal operating at half of the high frequency signal (f/2). Note that the divide by 2 must be clocked at the high frequency rate (f). The period of a 60 GHz clock is about 16.6 ps while the delay through a device or transistor is slightly more than this. Thus, if conventional CMOS circuit techniques are applied to the divide by 2 clocked at 60 GHz, conventional CMOS circuit techniques would prevent the operation of the divide by 2 since the delay through one CMOS device is larger than the clock period. This explains why designers are steered to the injection locked divider technique. Our technique offers a robust divide by 2 without resorting to the injection locked divider technique.

One of the embodiments of the disclosure removes the series bias transistor thereby increasing the headroom of differential amplifier. The increased headroom increases the dynamic range of applied signals. This feature allows faster performing circuits.

The conventional CMOS divide by 2 suffers from an RC delay caused by the capacitive load across the resistive load. A series peaking inductor is incorporated into each leg of the amplifier to tune out the output capacitance load that is coupled to the output of the differential amplifier. This effectively eliminates the RC delay thereby improving the performance of the circuit.

Another embodiment use vector summation of two orthogonal clocks to create a composite clock signal that has an amplitude that is 41% larger. This clock signal is used to enable/disable (switch) the differential amplifier and differential memory of a flip flop. The increased amplitude of the composite clock signal increases the gate to source voltage applied to the switched transistor causing the composite clock signal to improve the performance of the circuit.

An embodiment uses feed forward to a clocked differential amplifier. However, the feed forward path is not clocked. Instead, a current source regulates the current flow through the feed forward circuit. A current mirror can vary the current through the feed forward circuit. This current can be reduced to 0 or varied to shift the resonant behavior of the RLC load. The first case removes the feed forward circuit's behavior by tri-stating the feed forward circuit while the second case can be used to improve performance of the divide by 2 or adjust the resonant circuit characteristics of the RLC circuit.

Another embodiment of one of the present inventions is a switched differential amplifier comprising: a first differential cell; a load with a center tap coupling each leg of the first differential cell to a first power supply; a plurality of switches coupling a source of the first differential cell to a second power supply; each of the plurality of switches receiving a different signal, and at least one of the different signals has a different phase than the remaining signals, further comprising: a second differential cell; each leg of the second differential transistor corresponds to an equivalent leg in the first differential cell; each leg of the second differential cell is coupled to the corresponding center taps; and a single switch coupling a source of the second differential cell to the second power supply. The apparatus whereby the load is a series coupling of a resistor and a series peaking inductor, further comprising: a capacitance coupled to each leg of the first differential cell forming an RLC network, whereby the capacitance value can be electrically adjusted, whereby an impedance of the series peaking inductor matches a magnitude of the electrically adjusted impedance of the capacitor. The apparatus further comprising: a current mirror coupled to the single switch that adjusts a current flow through the single switch, whereby the current flow adjusts a resonant characteristic of the RLC network.

Another embodiment of one of the present inventions is a differential amplifier comprising: a first differential cell; a load with a center tap coupling each leg of the first differential cell to a first power supply; a current control coupling the first differential cell to a second power supply; a second differential cell; each leg of the second differential transistor corresponds to an equivalent leg in the differential cell; each leg of the second differential cell is coupled to the corresponding center taps; and a single switch coupling a source of the second differential cell to the second power supply, further comprising: a plurality of switches coupled between the source of the differential cell and the current control; each of the plurality of switches receiving a different signal, and at least one of the different signals has a different phase than the remaining signals, whereby the load is a series coupling of a resistor and a series peaking inductor. The apparatus further comprising: a capacitance coupled to each leg of the differential cell forming an RLC network, whereby the capacitance value can be electrically adjusted, whereby an impedance of the series peaking inductor matches a magnitude of the electrically adjusted impedance of the capacitor; a current mirror coupled to the single switch that adjusts a current flow through the single switch, whereby the current flow adjusts the characteristics of the resonant RLC network.

Another embodiment of one of the present inventions is a divide by 2 apparatus comprising: a clocked master differential amplifier with first balanced inputs and first balanced output leads; a complimentary clocked master memory storage unit with a first balanced memory leads coupled to the first balanced output leads; a complimentary clocked slave differential amplifier with second balanced inputs coupled to the first balanced memory leads; the complimentary clocked slave differential amplifier with second balanced output leads; a clocked slave memory storage unit with a second balanced memory leads coupled to the second balanced output leads; and the second balanced memory leads cross-coupled to the first balanced inputs; whereby each of the clocked differential amplifiers and memory storage units use two switches in parallel to enabled or disable the differential amplifiers and memory storage units by applying a first high frequency clock to one switch and a second high frequency clock at the same frequency but with a different phase to the other switch, whereby the first and second balanced memory leads provide the divide by 2 clock outputs, whereby the different phase is 90°, whereby a composite clock is the phasor addition of the two high frequency clocks.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be through and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

FIG. 1a depicts a Phase look Loop (PLL).

FIG. 1b shows dual modulus PLL with two counters.

FIG. 3a presents another dual modulus PLL in accordance with the present invention.

FIG. 3b illustrates a block representation of a divide by 2 in accordance with the present invention.

FIG. 3c depicts a CMOS circuit implementation of a divide by 2 further identifying the latches in accordance with the present invention.

FIG. 4a illustrates the CMOS circuit implementation of a divide by 2 further identifying the components of the latches in accordance with the present invention.

FIG. 4b presents the timing diagram of FIG. 4a in accordance with the present invention.

FIG. 4c depicts the master differential amplifier component of the divide by 2 in accordance with the present invention.

FIG. 6a shows a timing diagram for the clock amplifier embodiment in accordance with the present invention.

FIG. 6b depicts a simplified model of the differential amplifier with the clock amplification devices in accordance with the present invention.

FIG. 6c illustrates the replacement of a single device and single clock for the clock amplifier of the circuit in FIG. 6b in accordance with the present invention.

FIG. 6d shows the window that the input signal D is valid before and after the signal $\overline{X}$ changes state in accordance with the present invention.

DETAILED DESCRIPTION OF THE INVENTION

The inventions presented in this specification can be used in high frequency system designs. Several embodiments are presented where any combination of these embodiments can be included into the circuit design. Although a divide by 2 is illustrated as benefiting from these techniques, these techniques can also be applied to other high speed circuits.

FIG. 1a illustrates a conventional PLL. The reference frequency from a crystal of $f_{ref}$ is divided down by the divide by R block 1-1. The low frequency signal is compared in the PDF (Phase and Frequency Detector) against the variable clock signal 1-11. The VCO 1-4 generates the high frequency signal $f_{out}$. This signal is presented to the prescalar 1-5 and is divided by N and compared against a reference signal in the PFD block 1-2. The output of the PFD is low pass filtered (LPF 1-3) to generate a DC voltage that is applied to the VCO to adjust the high frequency signal $f_{out}$.

In FIG. 1b, a dual modulus prescalar is presented and allows division by one of two numbers. Depending on the value of the program counter 1-8 (value of P) or the swallow counter 1-10 (value of S), the dual modulus prescalar 1-7 either divides the high frequency signal $f_{out}$ by N and or the quantity N+1. The value of P is always greater than the value of S. The S counter 1-10 and gate 1-9 counts down and divides $f_{out}$ by N+1 until the S counter reaches zero, then the program counter is enabled and the prescalar divides by N for the remaining count within P. The $f_{ref}$ signal is divided down by the reference divider 1-6 and compared within the PFD. The LPF and VCO blocks function as before.

Figures 2A, 2B:
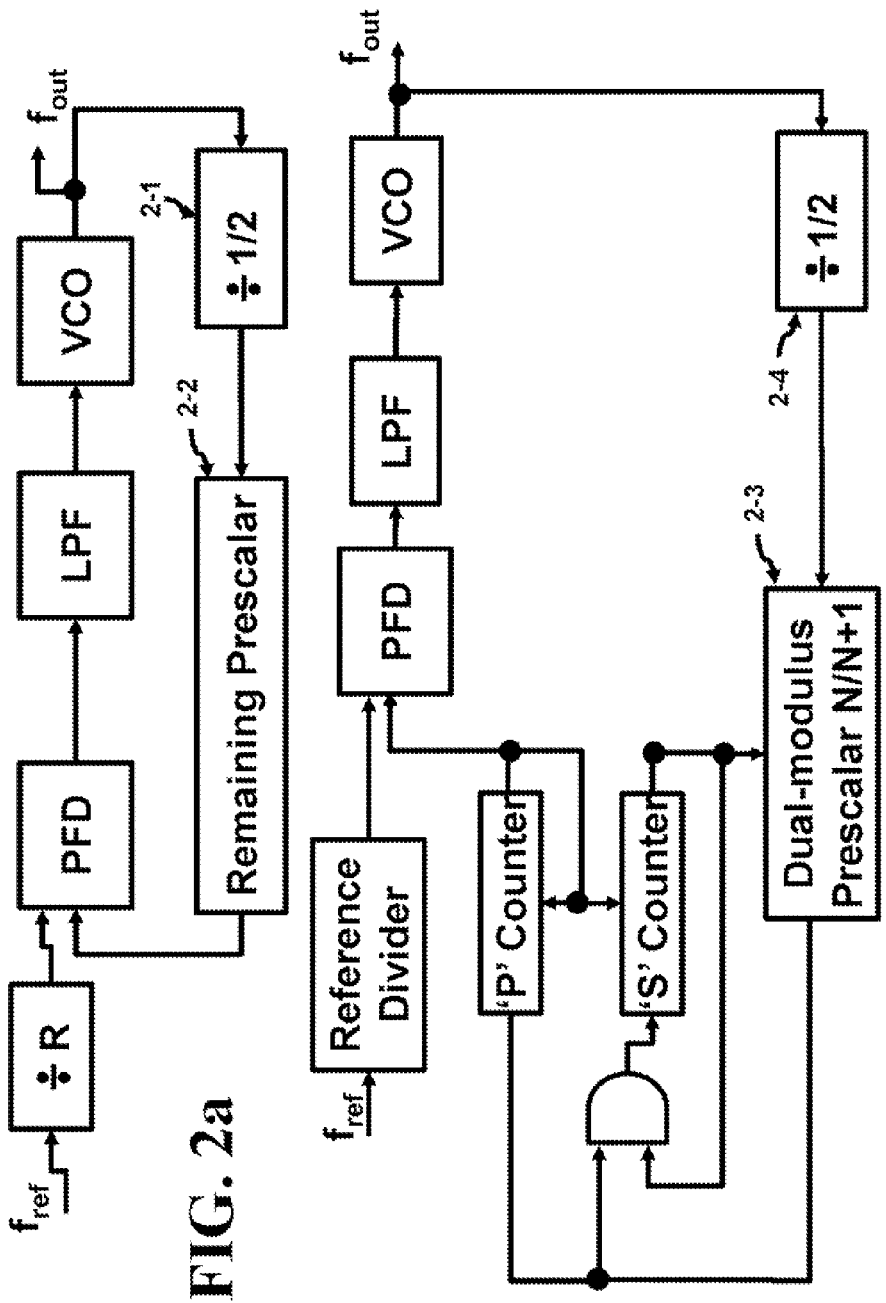
FIG. 2a illustrates the PLL illustrated in FIG. 1a with a divider by 2 in the prescalar path in accordance with the present invention.
FIG. 2b depicts the dual modulus PLL illustrated in FIG. 1b with a divide by 2 in the prescalar path in accordance with the present invention.

In FIG. 2a, the feedback path of the prescalar is partitioned into the two blocks. The first is a divide by 2 2-1 which divides $f_{out}$ by two reducing this critical frequency by half. The clock period is now doubled to about 33 ps. Thus, one of the basic components in the prescalar function is the divide by 2 block 2-1 that divides the high frequency signal in half and doubles the amount of available processing time. By introducing a second divide by two (not shown), the clock period would then be 66 ps providing for much more time to perform additional processing within more complex circuit configurations. The remaining component of the prescalar 2-2 generates the clock signal that's compared against a reference signal in the PFD.

FIG. 2b illustrates the dual modulus prescalar partitioned in series. The high frequency output clock signal $f_{out}$ is divided by two in 2-4. The remaining dual modulus prescalar block 2-3 now needs to only be concerned with a clock signal that has twice the period of the initial clock signal $f_{out}$ if the period of time is still insufficient, an additional series divide by two can be inserted into the prescalar to further increase the available period of time available to the computation circuits.

FIG. 3a illustrates another embodiment of a PLL operating at 60 GHz. The phase and frequency detector PFD compares $f_{ref}$ against the output of the dual modulus prescalar. The PFD is applied to the charge pump 3-1 the output of the charge pump is filtered by the low pass filter LPF and applied to the voltage controlled oscillator. The VCO in this case is a quadrature VCO generating the real clock signals at 0° and 180° as well as generating the imaginary clock signals at 90° and 270°. The real and imaginary clock signals from the orthogonal signals and are called $C_1$ and $C_Q$ signals, respectively. All of the clock outputs of the VCO are loaded with matched loads to ensure that the relative phase differences between the real and imaginary generated clock signals remains orthogonal.

The $C_1/C_Q$ clock signals are divided by 2 3-2 to reduce the frequency and increase the period of time for calculation. In addition, the signal is further divided by 2 3-3 but can now use a conventional divide by 2 circuit structure. The remainder of the dual modulus prescalar is the modulus divide by three or four 3-4 and the divide by N 3-5. The PLL is locked once up the prescaled high frequency clock signal tracks the clock frequency reference signal.

A block diagram of a differential divide by two is illustrated in FIG. 3b. A differential circuit operates on/generates differential or balanced input/output signals. The output of the differential flip-flop (DFF) is fed back to itself. This differential flip-flop requires the output and an $\overline{output}$ signal at the Q and $\overline{Q}$ outputs are feed back to the input and input bar signals D and the $\overline{D}$ to generate a clock outputs with a frequency that is half of the clock frequency being used to clock the differential flip-flop.

An MOS circuit schematic of the differential flip-flop is illustrated in FIG. 3c. The flip-flop consists of two latches in series; the first is the master latch and the second is called the slave latch. Each latch is structurally the same comprising a differential amplifier and a differential memory storage unit. Each alternately enabled in sequence. A bias control applied to transistor $N_1$ regulates the power dissipation and speed of the latch. The path is forked between transistors $N_2$ and $N_3$ that are alternately enabled in sequence by the CK and $\overline{CK}$ signal. The differential amplifier comprises of the transistors $N_4$ and $N_5$ along with the resistive loads $R_1$ and $R_2$ being enabled by the device $N_2$ clocked by the CK. The dotted loop 3-7 contains a differential cell which includes the two transistors $N_4$ and $N_5$ coupled together at their source and exiting the dotted loop at a node 3-8 called the source. The gates of $N_4$ and $N_5$ enter the dotted loop at 3-9 and 3-10, respectively, and are called inputs. The drains of $N_4$ and $N_5$ exit the dotted loop at 3-11 and 3-12, respectively, and are called legs. The differential memory storage comprises transistors $N_6$ and $N_7$ that are cross coupled to each other. The differential amplifier is coupled to the differential memory storage unit and provided to the slave latch. The slave latch, as pointed out earlier, is a replica of the master latch with the exception that the CK signals, CK and $\overline{CK}$, have been flipped. The outputs of the master latch are fed into the inputs of the differential amplifier of the slave latch. The output signals of the differential memory storage unit in the slave latch are coupled to the input signals of the differential amplifier in the master latch. This provides the required feedback in the differential flip-flop to generate a clock output signal that has half the frequency of the clock signal used to clock the differential flip-flop.

In FIG. 4a, the master slave latch divide by two is redrawn where the master latch is composed of a master differential amplifier and a master memory while the slave latch is composed of the slave differential amplifier and the slave memory. A dotted box 4-1 contains the circuit clocked by $\overline{CK}$. When $\overline{CK}$ goes low, the devices within box 4-1 become disabled, causing the master differential amplifier to become uncoupled from the slave memory cell. The leads 4-2 and 4-3 only see the capacitive load within the dotted box 4-1. Thus, the output nodes 4-4 and 4-5 from the dotted box 4-1 are tri-stated or they are not being driven. With the CK signal goes high, the master differential amplifier detects the differential signal at its inputs, while the slave memory is enabled to hold the previously clocked results.

The timing diagram in FIG. 4b helps to illustrate how the divide by 2 operates. The signals from top to bottom are the CK, $\overline{CK}$, D, $\overline{X}$ and $\overline{Q}$. At 4-11, the CK is rising, the D input to the master differential amplifier is high as shown causing $\overline{X}$ to go low 4-10 as indicated by the dotted line 4-15. Note that the D input has been valid for half the CK period 4-7 before the rising edge of CK and remains valid for an additional half of the CK period 4-9 after the rising edge of CK. This appears to be a setup and hold time respectively for the master differential amplifier to capture the input of D at node $\overline{X}$ but it is more than that. At 4-12, the $\overline{CK}$ is rising, the D input to the slave differential amplifier is high ($\overline{X}$) as shown causing $\overline{Q}$ to go high 4-17 as indicated by the dotted line 4-16. Note that the $\overline{X}$ input has been valid for half the CK period 4-14 before the rising edge of CK and remains valid for an additional half of the CK period 4-13 after the rising edge of CK. Similarly, as before, this appears to be a setup and hold time respectively for the slave differential amplifier to capture the signal on node $\overline{X}$ at $\overline{Q}$. However, in both cases this setup and hold time can potentially be extended and still allow the differential flip-flop to operate properly.

Returning back to 4-11, when the CK is rising, $\overline{CK}$ is falling causing the elements inside the box 4-1 to be disabled. Thus, the load on the nodes X and $\overline{X}$ is purely capacitive and does not propagate past the box 4-1. The master differential amplifier along with the capacitive load is illustrated in FIG. 4c when clock goes high. This is a very critical stage in the performance of the differential flipped since this stage must be able to extract out the information on the differential signal comprising of D and $\overline{D}$ and transport that signal to the nodes $\overline{X}$ and X, respectively. As pointed out earlier, the period of the clock at 60 GHz is about 16.6 ps which are slightly greater than the gate delay of a single device, for example, the transistor $N_2$. The node 4-18 will barely reach the required voltage within the time period of 16.6 ps. Furthermore, the propagation delay through the transistors N4 and N5 have not even been addressed yet. Thus, the master differential amplifier within the conventional differential flip flop structure fails to perform at 60 GHz. Innovative solutions are required in order for the master differential amplifier within the differential flip-flop to be able to operate at 60 GHz.

Various embodiments of these innovative solutions are presented in FIG. 5 and FIG. 6. In FIG. 5a, the master differential amplifier is redrawn from FIG. 4 and three regions are identified within this circuit. The first region 5-1 encompasses the RC network of $R_1$ and $C_1$ which introduces an RC time constant at node $\overline{X}$. The second region 5-2 encompasses one of the switching transistors $N_4$ and the transistor driven by the CK signal $N_2$. This circuit is effectively two transistors in series which causes the propagation delay to surpass the time period of 16.6 ps. Filially the last region 5-3 has isolated the bias transistor $N_1$. Each of these regions is analyzed so that the innovative solution that is presented is appreciated.

Figure 5A:
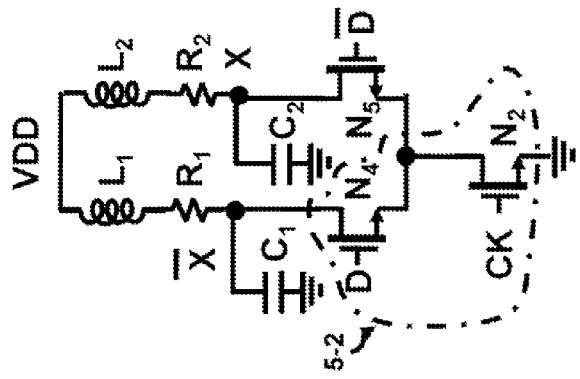
FIG. 5a presents the master differential amplifier component further partitioned into three regions in accordance with the present invention.
Figure 5B:
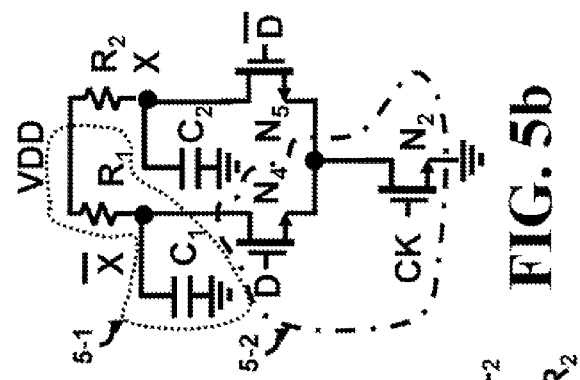
FIG. 5b illustrates a removal of one of the regions in accordance with the present invention.

The embodiment depicted in FIG. 5b reveals that the bias transistor $N_1$ has been completely removed. The power supply for this circuit is a little over one volt and in terms of headroom every means to increase the headroom would be very desirable to help improve the performance of the circuit. Removing the biasing transistor increases the headroom but seems to lack the ability to control the current in the circuit. This control will be added in later.

Figure 5C:
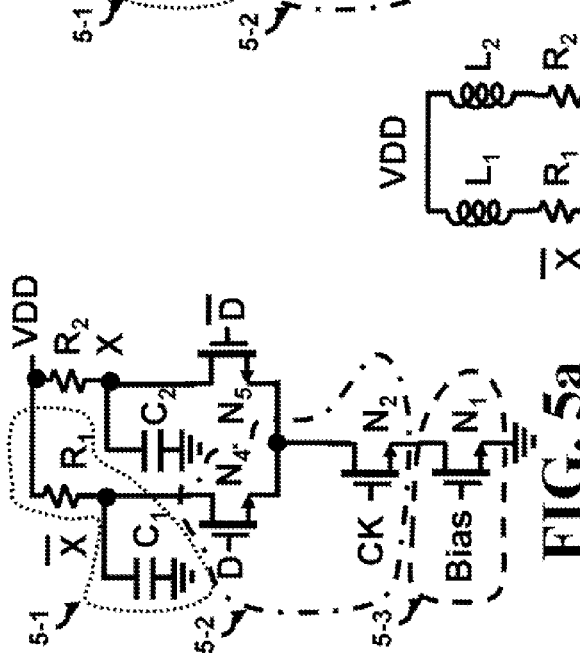
FIG. 5c presents a series peaking inductor to compensate one of the remaining regions in accordance with the present invention.

The embodiment illustrated in FIG. 5c shows series peaking inductors, $L_1$ and $L_2$, added into each leg of the differential amplifier. The series peaking inductor resonates out the capacitance of $C_1$ and removes the concern of the RC time constant identified earlier between the components $R_1$ and $C_1$. In addition, although not shown, the capacitance $C_1$ can be dynamically adjusted to a different value electronically such that the resonant peak of the RLC circuit comprising $L_1$, $R_1$ and $C_1$ can be adjusted. The dynamically adjusted capacitance of $C_1$ is used to tune the response of the balance differential amplifier.

Figure 5D:
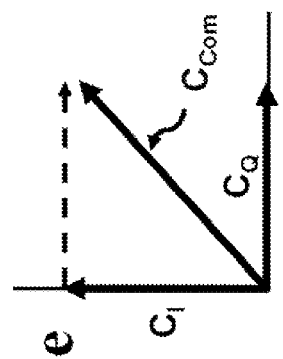
FIG. 5d illustrates a clock amplifier replacement in the last region in accordance with the present invention.
Figure 5E:
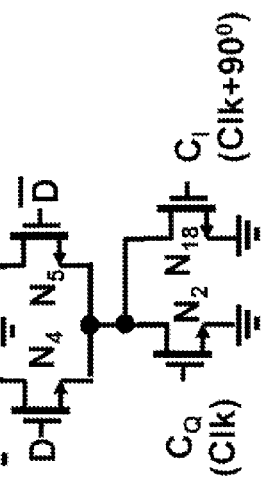
FIG. 5e depicts the vector addition providing the clock amplification in accordance with the present invention.

Another embodiment shown in FIG. 5d illustrates how the single clock signal applied previously to the single device $N_2$ is being replaced by two clock signals each being applied to one of the two parallel devices $N_2$ and $N_{18}$. These devices $N_2$ and $N_{18}$ can also be viewed as switches since the clock signal fully enables or fully disables these devices. The original clock signal, CK, is equivalent to $C_Q$ or $C_1$ except for possibly a phase difference. Thus, the signal $C_Q$ is used to clock transistor $N_2$. Similarly the new device or transistor $N_{18}$ is clocked by the imaginary clock signal $C_1$. The clock signals $C_1$ leads the clock signal $C_Q$ by 90°. This phasor representation of the two clock signals $C_Q$ and $C_1$ are further illustrated in FIG. 5e. By adding these two phasers together, the effective amplitude of the clock signal is now square root of two ($\sqrt{2}$) greater than the magnitude of either $C_1$ or $C_Q$. This additional amplitude improves the propagation delay of evaluating the signal at $\overline{X}$ or X.

FIG. 6a further illustrates the amplitude of adding the two orthogonal clock signals $C_1$ and $C_Q$ together. The clock $C_Q$ contributes portion 6-1 to $C_{com}$ while clock $C_1$ contributes portion 6-2 $C_{com}$. The magnitude of C, and is ($\sqrt{2}$) times larger than either of the individual clock signals $C_1$ or $C_Q$. The duration of $C_{com}$ 6-3 has the same duration as either of the individual clock signals.

The embodiment in FIG. 6b illustrates the feed forward innovation to help accelerate the evaluation of the signal at $\overline{X}$ and X. The new devices or transistors that have been added include the device $N_{15}$ controlled by the analog signal $V_{nb}$. Additionally, two transistors $N_{16}$ and $N_{17}$, sharing a common source that is coupled to the drain of device $N_{15}$. The drains of $N_{16}$ and $N_{17}$ each connect to the tap point 6-4 and 6-5 in to one of the legs of the differential master amplifier. The dotted loop 6-9 identities the load coupled between the legs of the differential cell and the power supply. The tap point 6-10 occurs between the series peaking inductor and the resistive load, for example, between $L_2$ and $R_2$. Note that the path from the tap point through device $N_{15}$ to ground does not contain an element that is clocked. So if the transistor $N_{15}$ is enabled, the signals D and $\overline{D}$ are applied to the gates of $N_{16}$ and $N_{17}$ to influence the two nodes $\overline{X}$ and X before the differential portion of the gate is enabled by the by either of the two clock signals $C_Q$ or $C_1$. If $V_{nb}$ enables $N_{15}$, then this feed forward path helps to speed up the evaluation of the balance differential master amplifier.

To simplify the diagrams, the two transistors $N_2$ and $N_{18}$ as depicted in FIG. 6b are combined into one controlled current source $I_C$ as is illustrated in FIG. 6c. Similarly, the effective combination of the individual clock signals $C_Q$ and $C_1$ is represented by the single clock signal $C_{com}$ as previously shown in FIG. 5e.

The waveforms for the master differential amplifier illustrated in FIG. 6c are provided in FIG. 6d. Assume that: 1) the D waveform has been generated by slave latch (not shown) clocked by the $\overline{C_{com}}$ signal as illustrated in the two top waveforms; and 2) the voltage $V_{nb}$ is set to VSS to disable the feed forward path. The rising edge of the $\overline{C_{com}}$ event 6-6 enables the controlled current source in the slave latch and causes waveform D to change from a low to a high. Similarly, the next rising edge event 6-8 causes the waveform D to change state from a high to a low. The master differential amplifier in FIG. 6c is enabled when the rising edge of $C_{com}$ is applied to the controlled current source $I_c$. Note that the rising edge of $C_{com}$ occurs approximately in between the rising and falling edges of waveform D. The waveform D is "set up" ahead of time by 4-7 and waveform D is held for a "hold time" of 4-9. Once $C_{com}$ goes high at time 4-10, the output of the master differential latch $\overline{X}$ goes low.

Figures 7A, 7B:
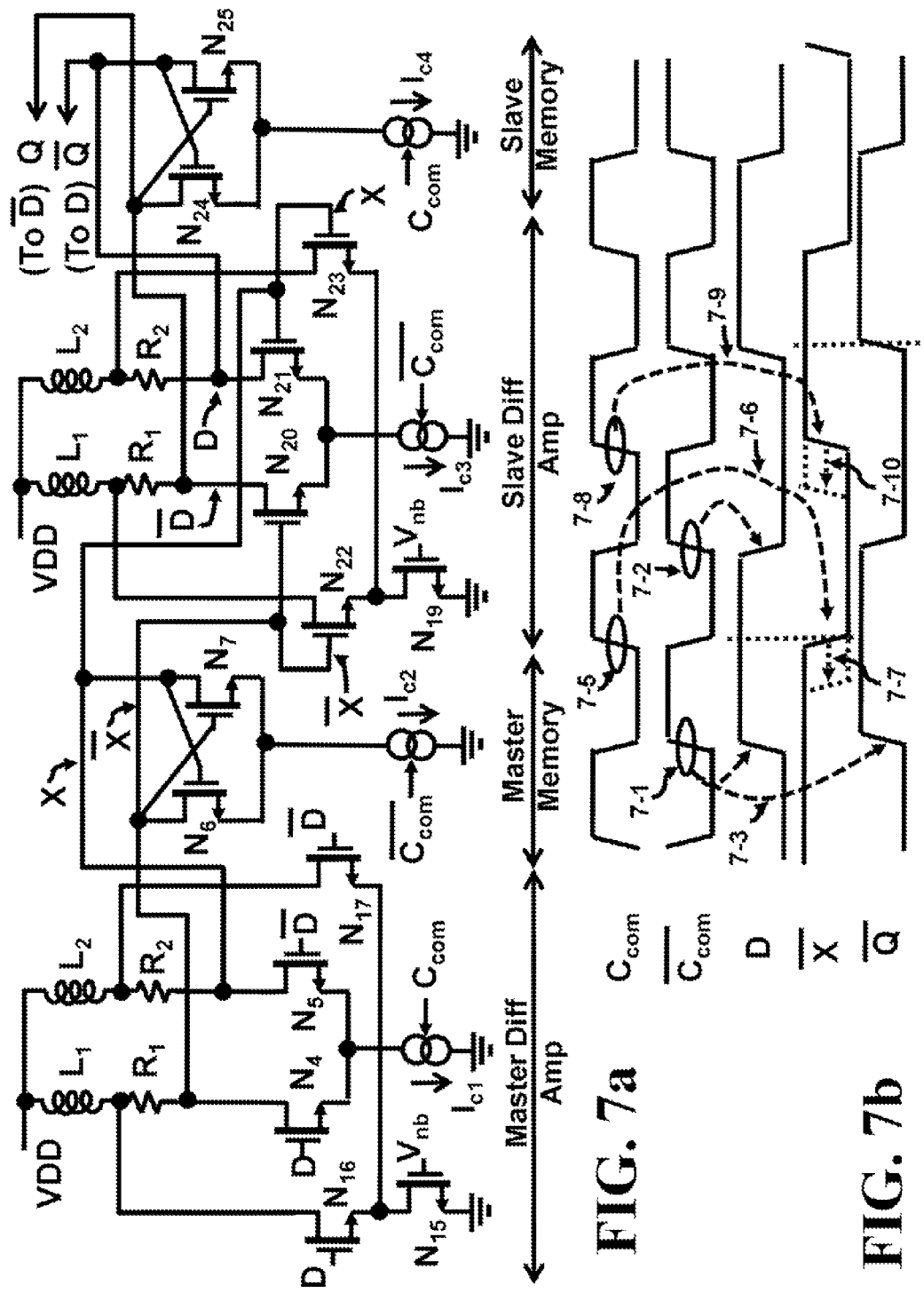
FIG. 7a depicts the divide by 2 using several embodiments simultaneously in accordance with the present invention.
FIG. 7b illustrates a timing diagram for the divide by 2 in FIG. 7a in accordance with the present invention.

FIG. 7a illustrates one embodiment of a differential flip-flop configured to divide by 2 while FIG. 7b provides the corresponding waveforms. A clocked master differential amplifier with first balanced inputs (D and $\overline{D}$) and first balanced output leads (X and $\overline{X}$) coupled to a complimentary clocked master memory storage unit with a first balanced memory leads (X and $\overline{X}$) coupled to the first balanced output leads (X and $\overline{X}$). A complimentary clocked slave differential amplifier with second balanced inputs (X and $\overline{X}$) coupled to the first balanced memory leads (X and $\overline{X}$). The complimentary clocked slave differential amplifier with second balanced output leads (Q and $\overline{Q}$) coupled to a clocked slave memory storage unit with a second balanced memory leads (Q and $\overline{Q}$) coupled to the second balanced output leads (Q and $\overline{Q}$); and the second balanced memory leads cross-coupled to the first balanced inputs ($\overline{D}$ and D) providing the appropriate feedback. Each of the clocked differential amplifiers and memory storage units use two switches (devices, transistors, etc.) in parallel to enabled or disable the differential amplifiers and memory storage units. A first high frequency clock is applied to one switch and a second high frequency clock at the same frequency but with a different phase is applied to the other switch. These two switches are combined together and represented as a controlled current source $I_{c1}$ as described previously in FIG. 6c. The two high frequency clocks are represented by the single signal $C_{com}$. These controlled current sources $I_{c1}$, $I_{c2}$, $I_{c3}$ and $I_{c4}$ enable and control the master differential amplifier, the master memory, the slave differential amplifier and the slave memory, respectively.

For FIG. 7a, assume that $V_{nb}$ enables the devices or transistors $N_{15}$ and $N_{19}$ so that the feed forward paths become operational. The amount of feed forward is controlled by the current through the devices or transistors $N_{15}$ and $N_{19}$. A current source (not shown) is used to generate the voltage $V_{nb}$. The current control can be used to adjust the positioning of the resonant frequency of the amplifier. The master differential amplifier requires D and $\overline{D}$ inputs which are provided by a feedback path from the slave memory portion of the differential flip-flop. That is, the Q output of the balance differential amplifier is applied in the feedback path back to the $\overline{D}$ input and the $\overline{Q}$ output is fed back to the D input. Thus, in FIG. 7b, once the $\overline{C_{com}}$ clock transitions from a low to high (7-1 and 7-2) in the slave differential amplifier, the $\overline{Q}$ output is modified 7-3 from a low to high as illustrated by the rising edge of $\overline{Q}$. The event 7-2 causes $\overline{Q}$ to change from a high to a low. Since $\overline{Q}$ is fed back to the D input of the differential flip-flop to create the divide by two, the D waveform is effectively identical to the $\overline{Q}$ waveform. It is the Q waveforms that are fed back and applied to the master differential amplifier portion of the differential flip-flop.

The master differential amplifier is enabled when $C_{com}$ goes high as indicated by the event 7-5 in FIG. 7b. This event 7-6 causes $\overline{X}$ to decrease from a high to a low along the solid path of the waveform of FIG. 7b. Note that this transition occurs between the rising and falling edges of D causing the "set up" and "hold time" to have approximately equal durations. The feed forward path is enabled since $V_{nb}$ enables $N_{15}$. This feed forward path causes the falling edge of $\overline{X}$ to advance in time to the left since D is high. $\overline{X}$ should go low earlier and this shift 7-7 is illustrated by the dotted portion of the falling edge curve of $\overline{X}$. Note that the other feed forward path with device $N_{17}$ is disabled since $\overline{D}$ is at a logic zero. This signal is captured by the master memory, and applied to the slave latch which operates in a similar manner when the $\overline{C_{com}}$ clock goes high.

The next time $C_{com}$ goes high again is indicated by the event 7-8. The master differential amplifier is enabled when $C_{com}$ goes high again as before. This event 7-9 causes $\overline{X}$ to increase from a low to a high along the solid path of the waveform of FIG. 7b. At approximately the same time, the signal X (not shown) decreases from a high to a low. However, note the first feedback path comprising $N_{14}$ is disabled (D is low) so $\overline{X}$ is not influenced by this first feed forward path instead, the second feed forward path with $N_{17}$ is enabled since $\overline{D}$ is high causing the X output to go low and shift the falling edge earlier. The effect is coupled through the differential pair coupling of $N_4$ and $N_5$ causing $\overline{X}$ should to go high earlier and shift 7-10 and shift the rising edge curve of $\overline{X}$ as illustrated by the dotted portion of the waveform. This shift of the falling and rising edge is of $\overline{X}$ cannot exceed 90° or 1.6.6/4 ps or 4.16 ps at 60 GHz, otherwise the edge would occur in one of the other three quadrants. However, test measurements indicate that this edge can be shifted several picoseconds yet still allowing the divide by 2 to operate reliably at 60 GHz.

The widths of the devices $N_{16}$ to $N_4$ is set to about a 1 to 3 ratio. If $N_{16}$ is increased in width decreasing this ratio, the shift of the waveforms at X and $\overline{X}$ advances too much and causes the flip-flop to fail. On the other hand, if $N_{16}$ is decreased in width raising this ratio, the effect of the shift of the waveforms at X and $\overline{X}$ may be negligible.

A switched differential amplifier comprising: a first differential cell; a load with a center tap coupling each leg of the first differential cell to a first power supply; a plurality of switches coupling a source of the first differential cell to a second power supply; each of the plurality of switches receiving a different signal, and at least one of the different signals has a different phase than the remaining signals, further comprising: a second differential cell; each leg of the second differential transistor corresponds to an equivalent leg in the first differential cell; each leg of the second differential cell is coupled to the corresponding center taps; and a single switch coupling a source of the second differential cell to the second power supply, and further comprising: a current mirror coupled to the single switch that adjusts a current flow through the single switch, whereby the current flow adjusts a resonant characteristic of the RLC network, whereby the load is a series coupling of a resistor and a series peaking inductor, further comprising: a capacitance coupled to each leg of the first differential cell forming an RLC network, whereby the capacitance value can be electrically adjusted, and whereby an impedance of the series peaking inductor matches a magnitude of the electrically adjusted impedance of the capacitor.

A differential amplifier comprising: a first differential cell; a load with a center tap coupling each leg of the first differential cell to as first power supply; a current control coupling the first differential cell to a second power supply; a second differential cell; each leg of the second differential transistor corresponds to an equivalent leg in the differential cell; each leg of the second differential cell is coupled to the corresponding center taps; and a single switch coupling a source of the second differential cell to the second power supply, further comprising: a capacitance coupled to each leg of the differential cell forming an RLC network, whereby the capacitance value can be electrically adjusted, and whereby an impedance of the series peaking inductor matches a magnitude of the electrically adjusted impedance of the capacitor. Further comprising: a current mirror coupled to the single switch that adjusts a current flow through the single switch whereby the current flow adjusts the characteristics of the resonant RLC network, further comprising: a plurality of switches coupled between the source of the differential cell and the current control; each of the plurality of switches receiving a different signal, and at least one of the different signals has a different phase than the remaining signals, whereby the load is a series coupling of a resistor and a series peaking inductor.

A divide by 2 apparatus comprising: a clocked master differential amplifier with first balanced inputs and first balanced output leads; a complimentary clocked master memory storage unit with a first balanced memory leads coupled to the first balanced output leads; a complimentary clocked slave differential amplifier with second balanced inputs coupled to the first balanced memory leads; the complimentary clocked slave differential amplifier with second balanced output leads; a clocked slave memory storage unit with a second balanced memory leads coupled to the second balanced output leads; and the second balanced memory leads cross-coupled to the first balanced inputs; whereby each of the clocked differential amplifiers and memory storage units use two switches in parallel to enabled or disable the differential amplifiers and memory storage units by applying a first high frequency clock to one switch and a second high frequency clock at the same frequency but with a different phase to the other switch, whereby the first and second balanced memory leads provide the divide by 2 clock outputs, whereby the different phase is 90°, and whereby a composite clock is the phasor addition of the two high frequency clocks.

Finally, it is understood that the above description are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. Although the circuits were described using CMOS, the same circuit techniques can be applied to depletion mode devices and BJT or biploar circuits, since this technology allows the formation of current sources and source followers. When a device is specified, the device can be a transistor such as an N-MOS or P-MOS. The CMOS or SOI (Silicon on Insulator) technology provides two enhancement mode channel types: N-MOS (n-channel) and P-MOS (p-channel) devices or transistors. Various embodiments have been described including: clock amplification, feed forward, series peaked inductors and headroom improvement. Each of these embodiments can be incorporated into a differential amplifier individually or combined in any combination.

What is claimed is:
1. A switched differential amplifier comprising:
a first differential cell driven by a differential input signal;
a first load with a first center tap couples a first leg of the first differential cell to a first power supply;
a second load with a second center tap couples a second leg of the first differential cell to the first power supply;
a plurality of switches for coupling a source of the first differential cell to a second power supply;
each of the plurality of switches receiving a different clock signal;
at least one of the different clock signals has a different phase than the remaining signals; and
the first and second center taps are coupled to a non-clocked version of the differential input signal.
2. The apparatus of claim 1, further comprising:
a second differential cell driven by the differential input signal;
each leg of the second differential cell corresponds to an equivalent leg in the first differential cell;
a first leg of the second differential cell is coupled to the first center tap;
a second leg of the second differential cell is coupled to the second center tap;
a transistor for coupling a source of the second differential cell to the second power supply, wherein
an analog signal enables the transistor.
3. The apparatus of claim 2, further comprising:
a current mirror coupled to the transistor that adjusts a current flow through the transistor.
4. The apparatus of claim 3, wherein
the current flow adjusts a resonant characteristic of a RLC network.
5. The apparatus of claim 1, wherein
each of the first and second loads is a series coupling of a resistor and a series peaking inductor.
6. The apparatus of claim 5, further comprising:
a capacitance coupled to each leg of the first differential cell forming a RLC network.
7. The apparatus of claim 6, whereby
the capacitance value can be electrically adjusted.
8. The apparatus of claim 7, wherein
an impedance of the series peaking inductor matches a magnitude of the electrically adjusted impedance of the capacitor.
9. A differential amplifier comprising:
a first differential cell;
a first load with a first center tap couples a first leg of the first differential cell to a first power supply;
a second load with a second center tap couples a second leg of the first differential cell to the first power supply;
a current control for coupling the first differential cell to a second power supply;
a second differential cell;
each leg of the second differential cell corresponds to an equivalent leg in the first differential cell;
a first leg of the second differential cell is connected to the first center tap;
a second leg of the second differential cell is connected to the second center tap; and
a transistor for coupling a source of the second differential cell to the second power supply, wherein
an analog signal enables the transistor.
10. The apparatus of claim 9, further comprising:
a plurality of switches coupled between the source of the first differential cell and the current control;
each of the plurality of switches receiving, a different signal, and
at least one of the different signals has a different phase than the remaining signals.

11. The apparatus of claim 9, wherein each of the first and second loads is a series coupling of a resistor and a series peaking inductor.

12. The apparatus of claim 9, further comprising: a capacitance coupled to each leg of the differential cell forming an RLC network.

13. The apparatus of claim 12, whereby the capacitance value can be electrically adjusted.

14. The apparatus of claim 13, wherein an impedance of the series peaking inductor matches a magnitude of the electrically adjusted impedance of the capacitor.

15. The apparatus of claim 9, further comprising: a current mirror coupled to the transistor that adjusts a current flow through the transistor.

16. The apparatus of claim 15, whereby the current flow adjusts the characteristics of the resonant RLC network.

* * * * *